(12) United States Patent
Wei

(10) Patent No.: US 7,792,235 B2
(45) Date of Patent: Sep. 7, 2010

(54) DYNAMIC PHASE TRACKING USING EDGE DETECTION

(75) Inventor: Sen-Jung Wei, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 1215 days.

(21) Appl. No.: 10/351,590

(22) Filed: Jan. 27, 2003

(65) Prior Publication Data

US 2004/0001567 A1 Jan. 1, 2004

Related U.S. Application Data

(60) Provisional application No. 60/351,999, filed on Jan. 25, 2002.

(51) Int. Cl.
*H03D 3/24* (2006.01)
(52) U.S. Cl. .................. 375/376; 375/374; 375/375; 375/327
(58) Field of Classification Search .......... 375/256, 375/327, 342.346, 373, 376, 377, 371, 355, 375/356, 362, 375; 714/699, 700, 704, 706; 327/156, 140, 159
See application file for complete search history.

(56) References Cited

U.S. PATENT DOCUMENTS

| | | | | |
|---|---|---|---|---|
| 4,872,055 A * | 10/1989 | Teuling et al. | .............. | 348/542 |
| 5,509,038 A * | 4/1996 | Wicki | ......................... | 375/371 |
| 5,812,619 A | 9/1998 | Runaldue | | |
| 6,236,696 B1 | 5/2001 | Aoki et al. | | |
| 6,430,240 B1 * | 8/2002 | Eglit | ......................... | 375/355 |
| 6,611,219 B1 * | 8/2003 | Lee et al. | ..................... | 341/141 |
| 6,636,092 B1 * | 10/2003 | Stine | ......................... | 327/159 |
| 6,868,134 B2 * | 3/2005 | Yoshizaki | ................... | 375/354 |
| 6,937,683 B1 * | 8/2005 | Ratzel | ........................ | 375/376 |
| 6,959,058 B2 * | 10/2005 | Yoo et al. | .................. | 375/355 |

(Continued)

FOREIGN PATENT DOCUMENTS

TW 395094 6/2000

*Primary Examiner*—Chieh M Fan
*Assistant Examiner*—Qutbuddin Ghulamali
(74) *Attorney, Agent, or Firm*—Panitch, et al.

(57) ABSTRACT

A phase-locked loop includes a sample selector configured to select a set of samples from an oversampled portion of a data signal, a dynamic phase decision control configured to indicate whether a predetermined number of edges is present in the set of samples, and a phase detector configured to determine a skew condition and a direction of the skew condition of the set of samples based on the indication of the dynamic phase decision control. The phase detector is configured to determine a skew condition based on a relation between a threshold and a number of skew errors detected in the set of samples. A value of the threshold is selected according to the indication of the dynamic phase decision control. A lower value of the threshold is selected according to an indication of the dynamic phase decision control that only one edge is present in the set of samples. Furthermore, the dynamic phase decision control includes an edge detector configured to detect edges in the set of samples, and an edge counter configured to indicate the detection of the predetermined number of edges in the set of samples. Methods of determining a skew condition and a direction of the skew condition, and methods of determining whether a predetermined number of edges is present in the set of samples, are implemented using these elements.

5 Claims, 13 Drawing Sheets

U.S. PATENT DOCUMENTS

| | | |
|---|---|---|
| 6,977,965 B2 * | 12/2005 | Nguyen et al. ............... 375/279 |
| 6,988,227 B1 * | 1/2006 | Perrott ....................... 714/704 |
| 2002/0186782 A1 * | 12/2002 | Staszewski et al. ......... 375/295 |
| 2003/0055854 A1 * | 3/2003 | Choudhary ................. 708/300 |
| 2003/0086505 A1 * | 5/2003 | Nguyen et al. .............. 375/279 |
| 2003/0198302 A1 * | 10/2003 | Song ........................... 375/340 |

* cited by examiner

DYNAMIC PHASE TRACKING USING EDGE DETECTION

RELATED APPLICATIONS

This application claims priority to U.S. Provisional Patent Application No. 60/351,999, filed Jan. 25, 2002 and entitled "DYNAMIC PHASE DECISION DIGITAL PLL".

BACKGROUND

1. Field of the Invention
This invention relates to signal processing.
2. Background Information
In an oversampling data receiver system, a digital phase-locked loop (DPLL) may be applied to the oversampled signal to select the sample that best represents each oversampled bit. In a three-times oversampling system, for example, a DPLL may be used in selecting one sample out of each consecutive series of three samples. The DPLL indicates the proper sample by determining the phase relationship between the data and the clock.

It is desirable to improve the tracking behavior of such a system. It is also desirable to maintain noise rejection capability.

SUMMARY

A method of signal processing according to one embodiment of the invention includes detecting the presence of a predetermined number of edges in a segment of a data signal. The method also includes determining a relation between the number of occurrences of a predetermined phase transition condition in an oversampled portion of the data signal and a threshold value. In this method, the threshold value is selected according to the edge detecting.

DETAILED DESCRIPTION

Figure 1:
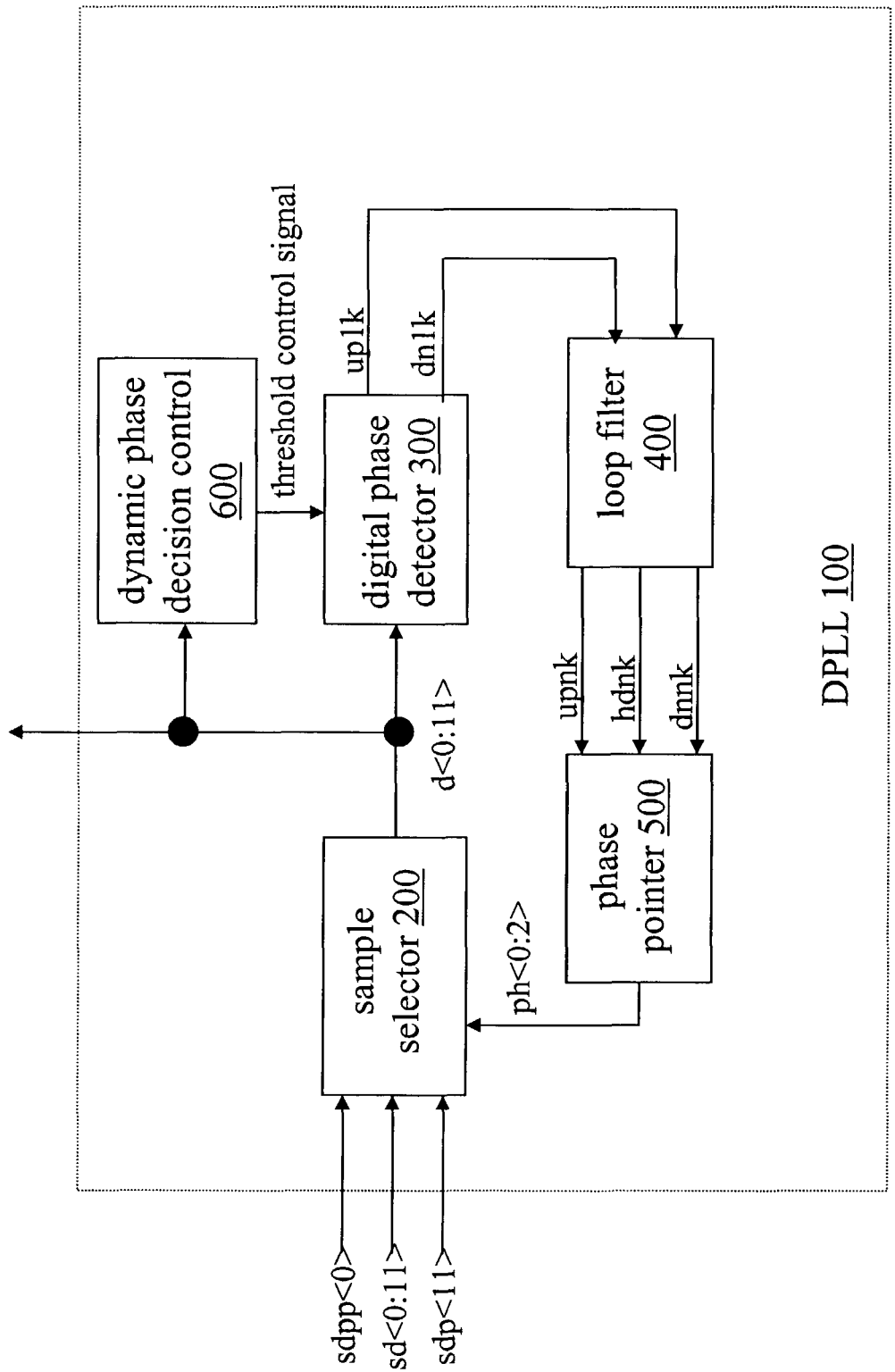
FIG. 1 shows a block diagram for a DPLL 100 according to an embodiment of the invention.

FIG. 1 shows an example 100 of a DPLL according to an embodiment of the invention. DPLL 100 receives oversampled data (e.g. as provided by a data oversampler) and selects a set of samples d according to a detected phase. The oversampled data may be generated, for example, by sampling using multiphase clocks. In the example illustrated, DPLL 100 receives fourteen samples of a data signal that has been three-times oversampled and selects a set of twelve samples that represent four oversampled data bits.

Figure 2:
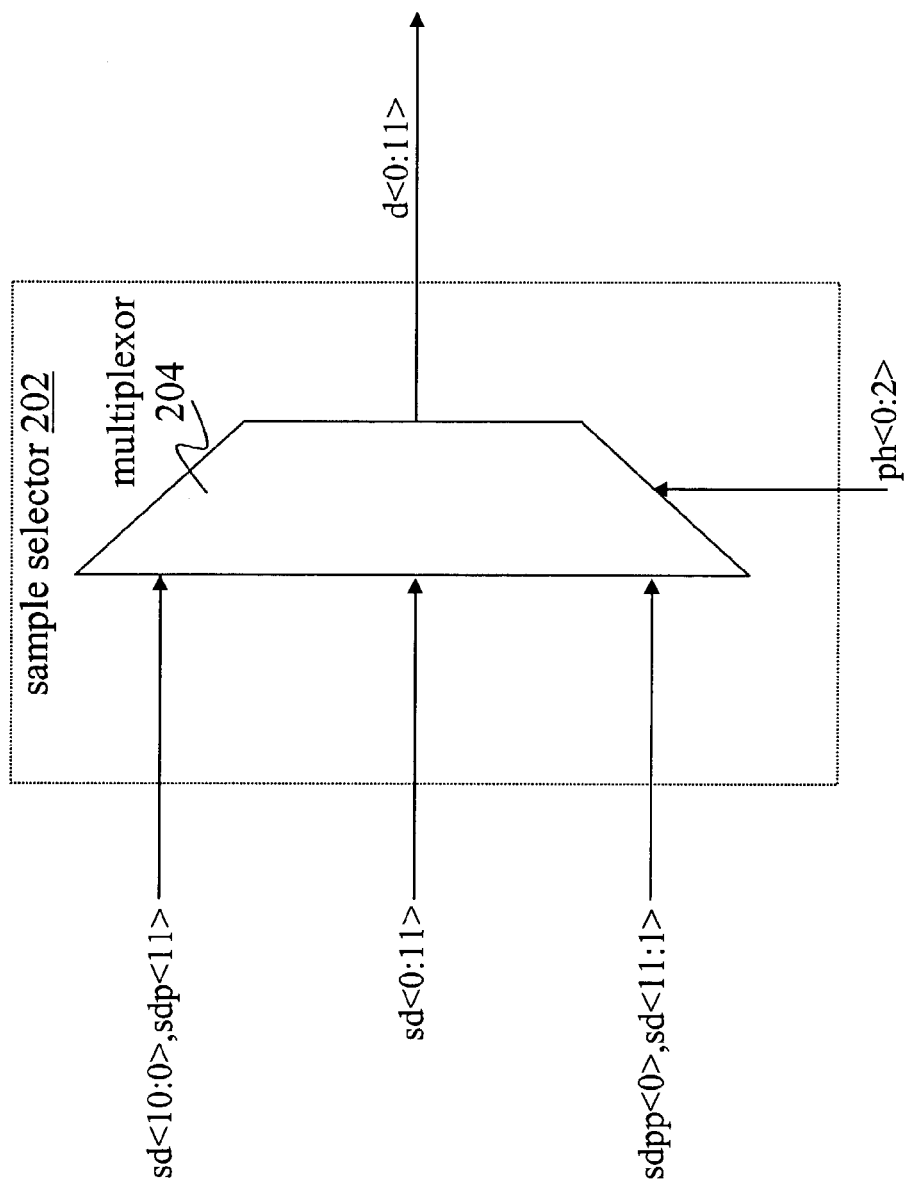
FIG. 2 shows a block diagram for an implementation 202 of sample selector 200.

FIG. 2 shows an implementation 202 of sample selector 200 that includes a multiplexor 204. In this example, multiplexer 204 receives the three consecutive sets of twelve samples of the fourteen-sample input signal. Based on the phase information ph<2:0>, multiplexer 204 passes one of the consecutive sets of twelve samples (representing four data bits, each oversampled three times) as data signal d<11:0>. This data signal is processed for skew detection as described below and may also be outputted to other processing circuitry (e.g. a downsampler).

Digital phase detector 300 evaluates the selected sample pattern to detect skew errors within it. Based on this evaluation, detector 300 outputs skew detection signals uplk and dnlk that indicate whether a skew of the selected set has been detected, and if so, in which direction the set is skewed (i.e. early or late).

Figure 3:
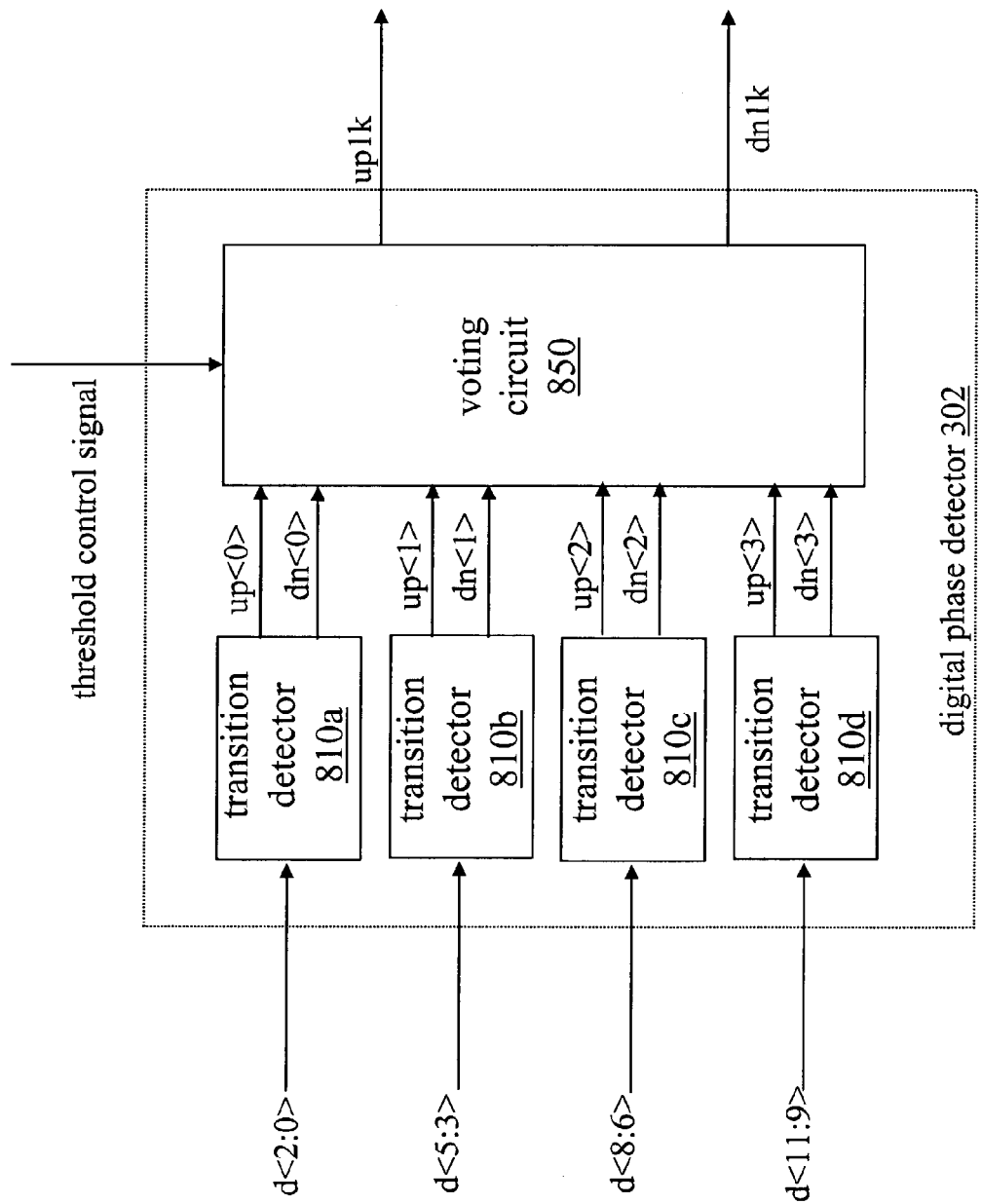
FIG. 3 shows a block diagram for an implementation 302 of digital phase detector 300.

FIG. 3 shows a block diagram of an implementation 302 of digital phase detector 300 that includes transition detectors 810a-d and a voting circuit 850. Each transition detector 810 receives a set of samples and indicates whether a skew error is detected among the samples. For example, a transition detector 810 may receive a set of samples corresponding to one oversampled bit and may detect whether a data transition has occurred within the set. If a skew error is detected, transition detector 810 also indicates in which direction its set is skewed (e.g. by asserting the corresponding one of its up and down output signals).

For example, in a set of three consecutive samples corresponding to one oversampled bit, in the absence of a skew error all three samples will have the same value. If the first sample is different than the other two, the set is skewed in one direction. If the last sample is different, then the set is skewed in the other direction.

Voting circuit 850 receives the skew indications, determines whether the number of skew indications in either direction reaches (or exceeds) a threshold value, and outputs corresponding skew detection signals uplk and dnlk. In this particular example, voting circuit 850 makes one or more of its skew determinations based on a threshold that may vary based on the content of the data signal.

Figure 4:
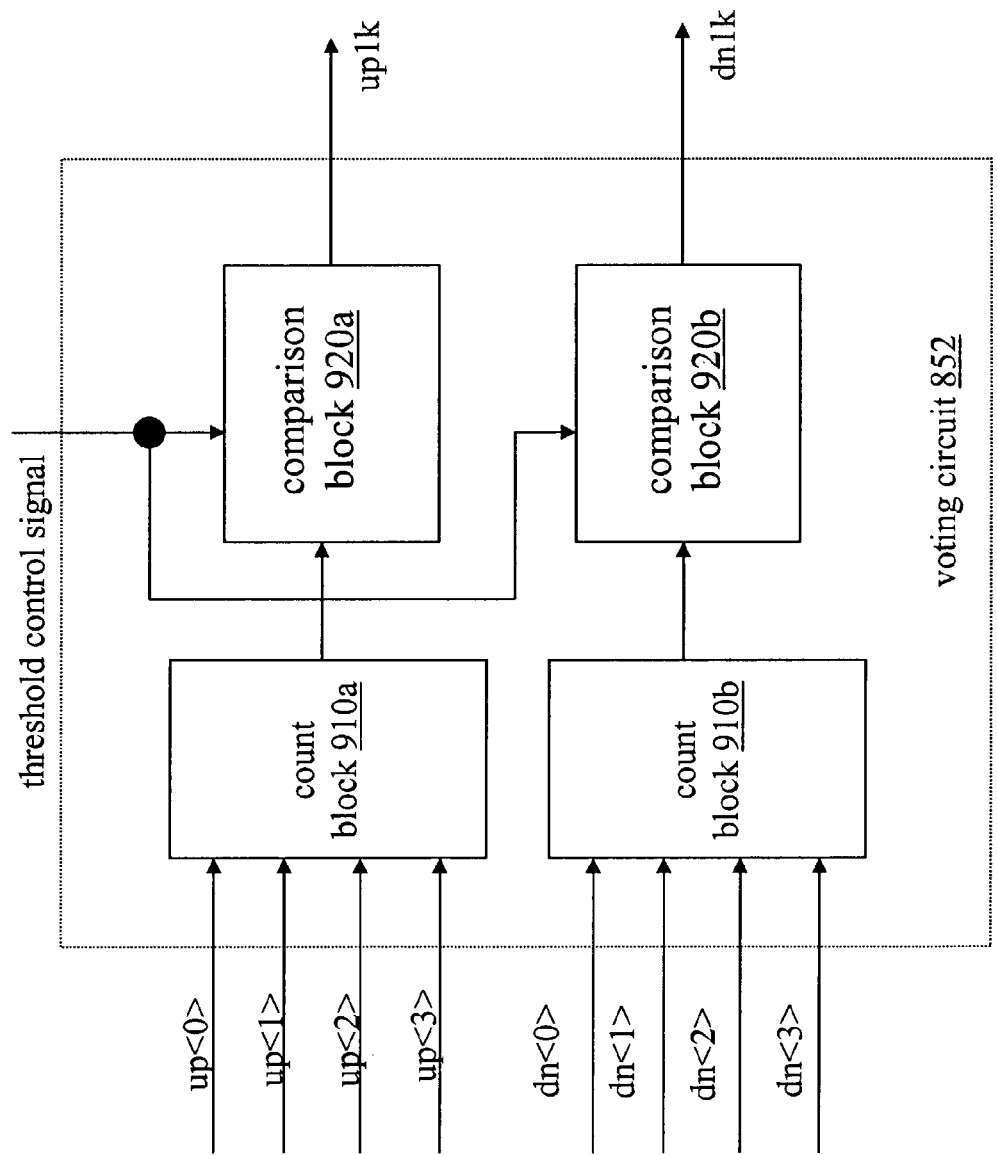
FIG. 4 shows a block diagram for an implementation 852 of voting circuit 850.

FIG. 4 shows an implementation 852 of voting circuit 850 that includes count blocks 910a, 910b and comparison blocks 920a, 920b. One of count blocks 910 counts the number of early skew errors detected, and the other counts the number of late skew errors detected. Comparison blocks 920a and 920b compare these numbers to thresholds and output skew detection signals uplk and dnlk according to the comparisons.

In one implementation of such a voting circuit, the threshold of one or both of the comparison blocks may be set to a fixed value (e.g. skew is decided if at least two corresponding transitions are detected). In another implementation, the thresholds of one or both comparison blocks may vary dynamically according to the content of the data signal. For example, each threshold may be set to a default value of two but dynamically changed to a value of one if only one edge is detected in the selected sample set.

Figure 5:
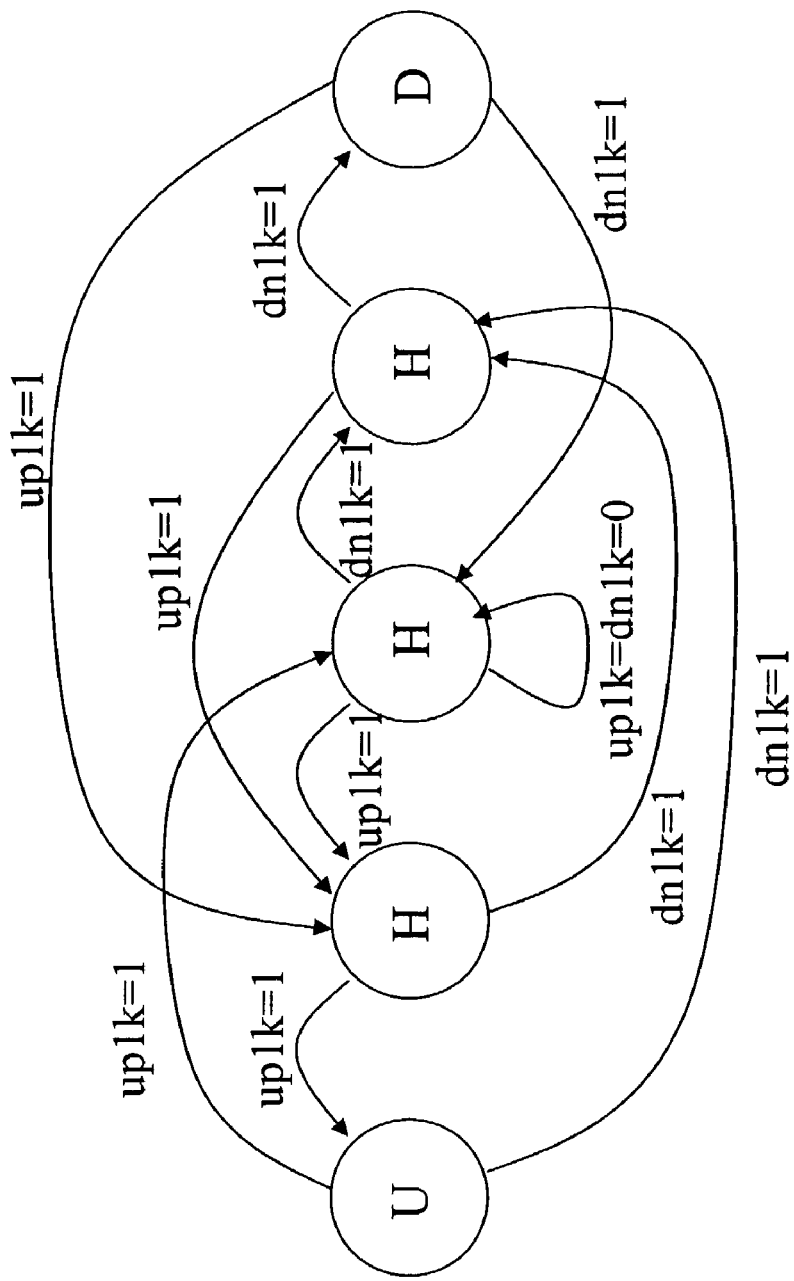
FIG. 5 shows a state diagram for a five-state implementation of loop filter 400.
Figure 6:
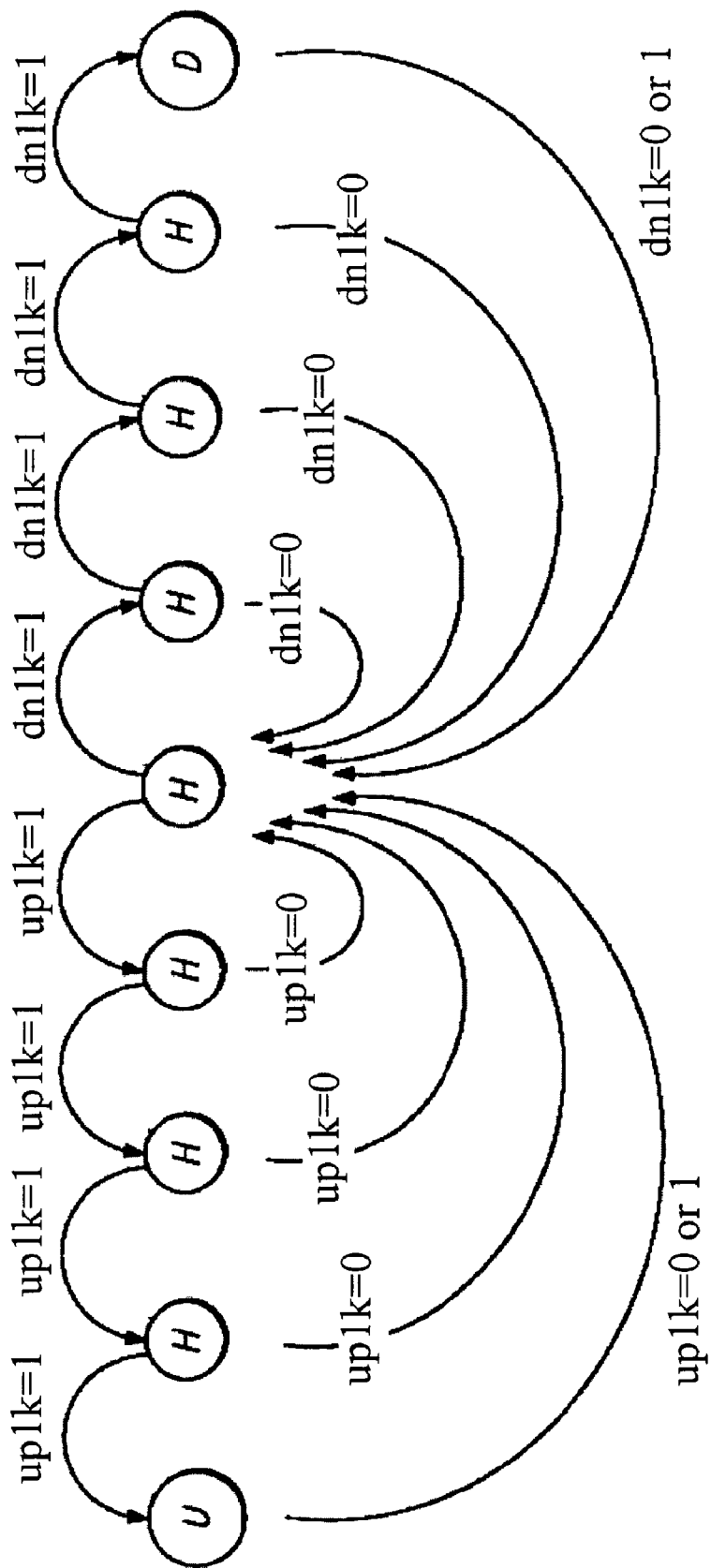
FIG. 6 shows a state diagram for a nine-state implementation 402 of loop filter 400.
Figure 7:
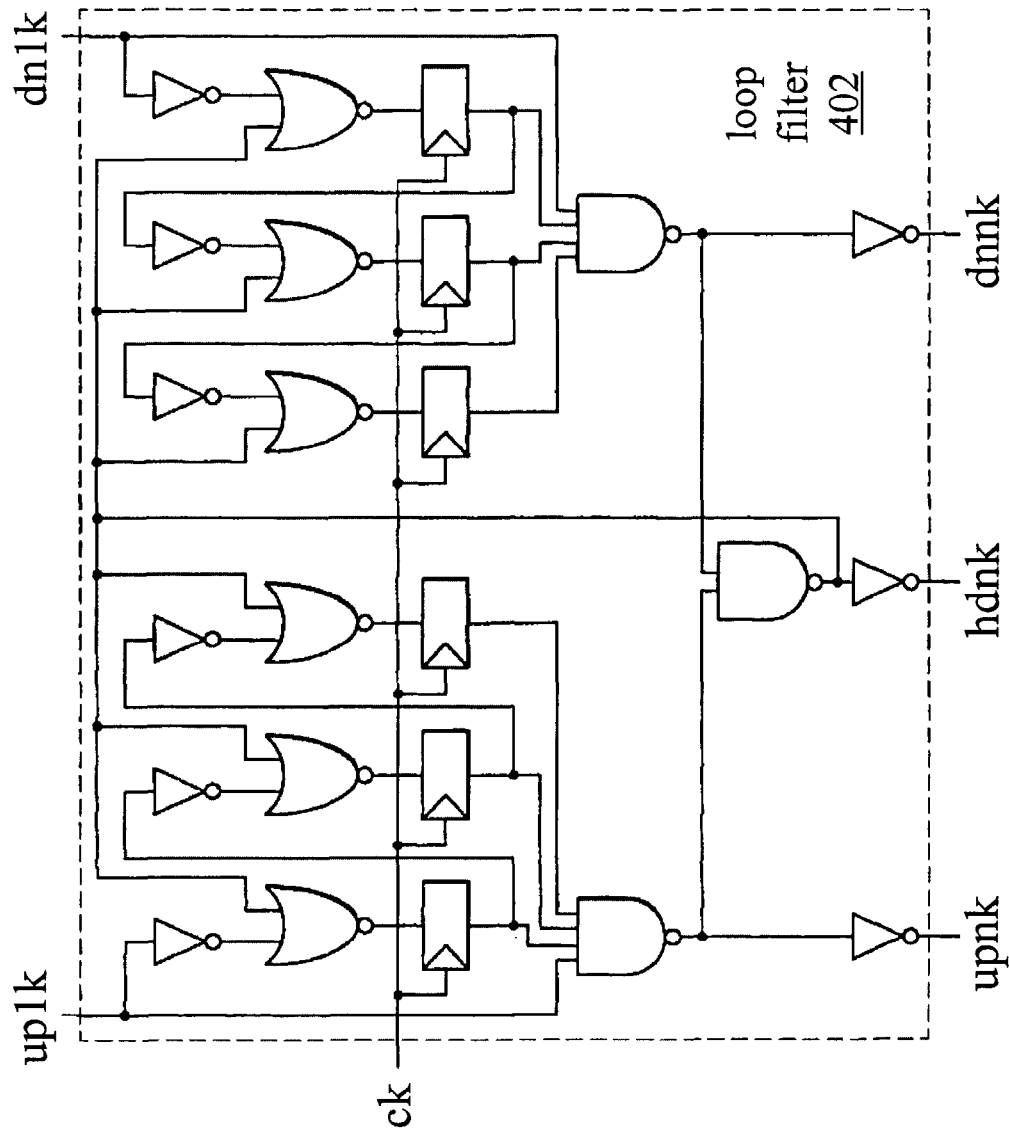
FIG. 7 shows a circuit diagram for loop filter 402.

Loop filter 400 filters the skew detection signals uplk and dnlk (e.g. to reduce jitter). Loop filter 400 may be implemented in analog, e.g. as a charge-pump circuit. Alternatively, loop filter 400 may be implemented digitally. FIG. 5 shows a state diagram for a five-state implementation of loop filter 400, which implementation may be used for an application in which only one of the skew detection signals uplk and dnlk is asserted at one time. FIG. 6 shows a state diagram for a nine-state implementation of loop filter 400, which implementation may be used for an application in which both of the skew detection signals uplk and dnlk may be asserted at one time. In FIGS. 5 and 6, the state labels H, U, and D indicate that loop filter 400 asserts the corresponding one of phase adjustment signals hdnk, upnk, and dnnk when in that state. FIG. 7 shows a circuit diagram for one nine-state implementation 402 of loop filter 400.

Figure 8:
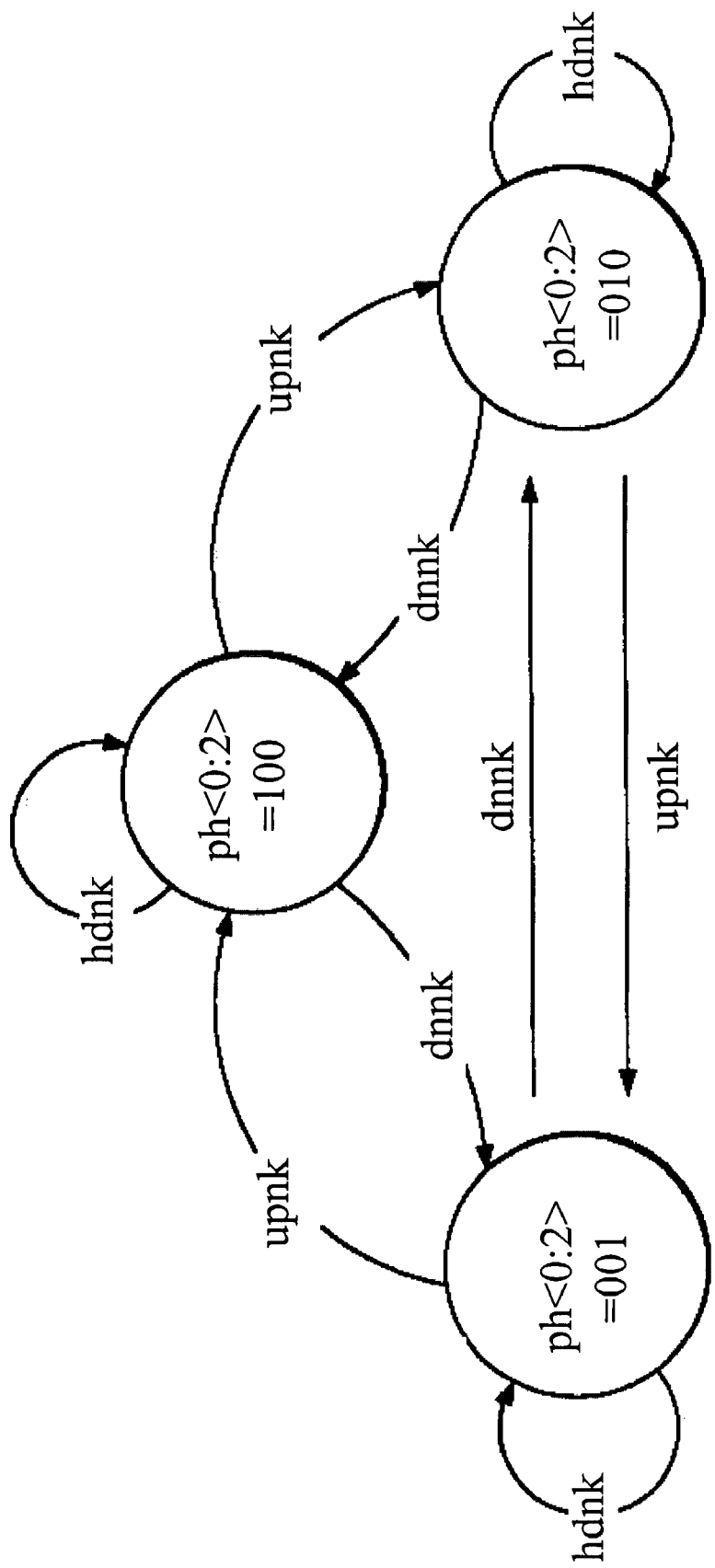
FIG. 8 shows a state diagram for an implementation 502 of phase pointer 500.
Figure 9:
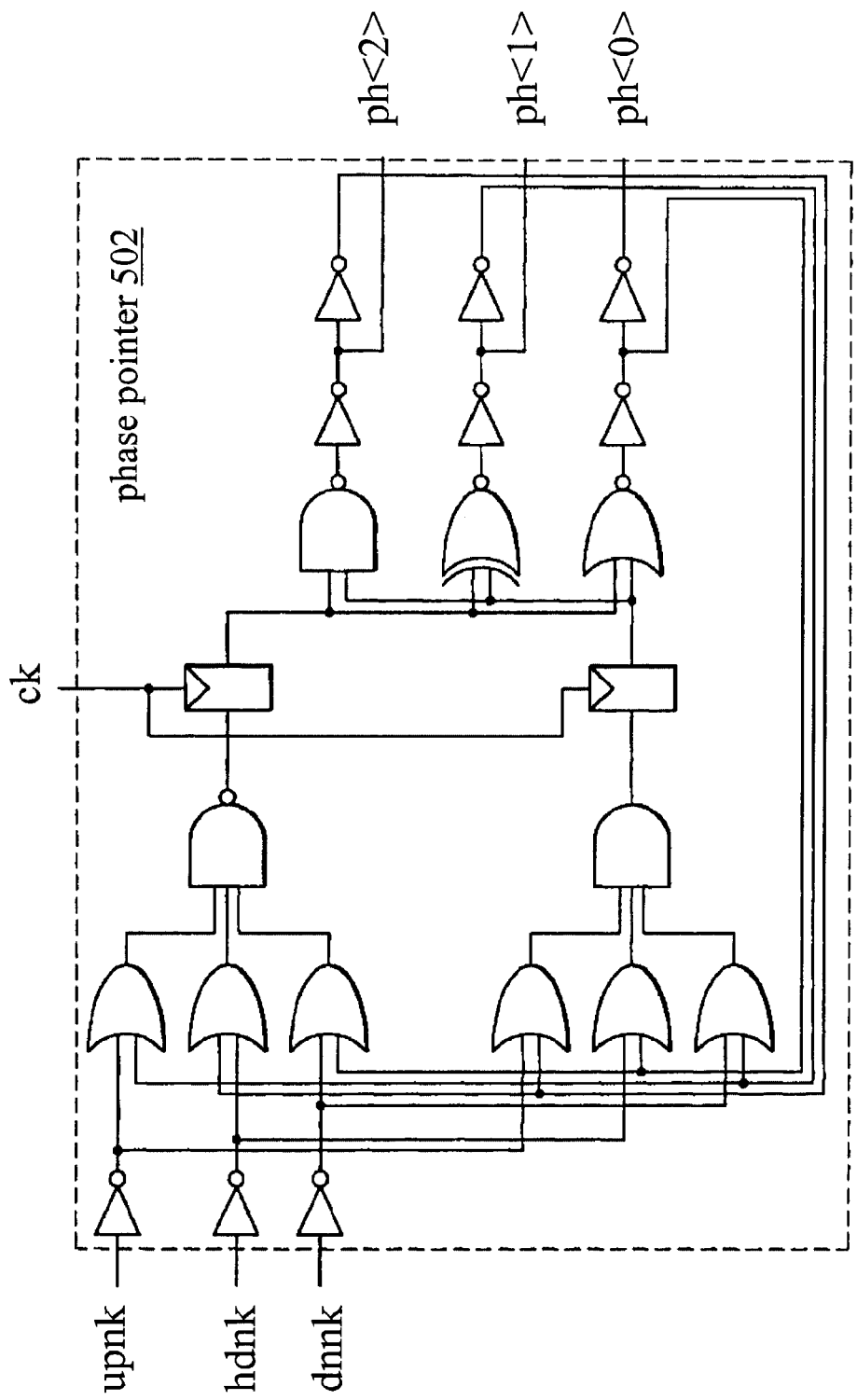
FIG. 9 shows a circuit diagram for phase pointer 502.

Phase pointer 500 indicates the center sample among the oversampled set. For example, phase pointer 500 may be implemented as a ring counter that circulates a single bit according to the phase adjustment signals upnk and dnnk. FIG. 8 shows a state diagram for an implementation of phase pointer 500 as a ring counter, and FIG. 9 shows a circuit diagram for one such implementation 502.

Figure 10:
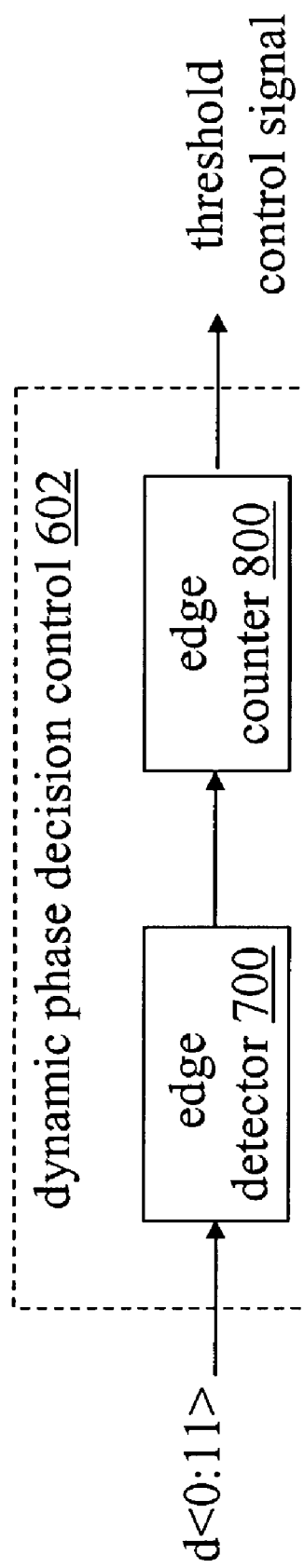
FIG. 10 shows a block diagram for an implementation 602 of dynamic phase decision control 600.

FIG. 10 shows a block diagram for an implementation 602 of dynamic phase decision control 600. Edge detector 700 detects edges within the data signal. For example, edge detector 700 may be implemented to compare each consecutive pair of the selected set of samples (d<0>and d<1>, d<1>and d<2>, d<2>and d<3>, etc.). Such a detector may be implemented using a corresponding number of XOR gates.

Edge counter 800 counts the number of detected edges. In the example of a set of twelve samples representing four data bits that are three-times oversampled, from zero to four edges may be present in such a set (actually, zero to five edges may be present if there is an error in the oversampling). In the example of FIG. 10, edge counter 800 outputs a binary-valued threshold control signal to digital phase detector 300 that indicates whether the presence of one and only one edge has been detected. Alternatively, edge counter 800 may be implemented to indicate the number of edges detected so that a module receiving such an indication (e.g. digital phase detector 300) may perform an appropriate operation (e.g. selection of an appropriate threshold).

Figure 11:
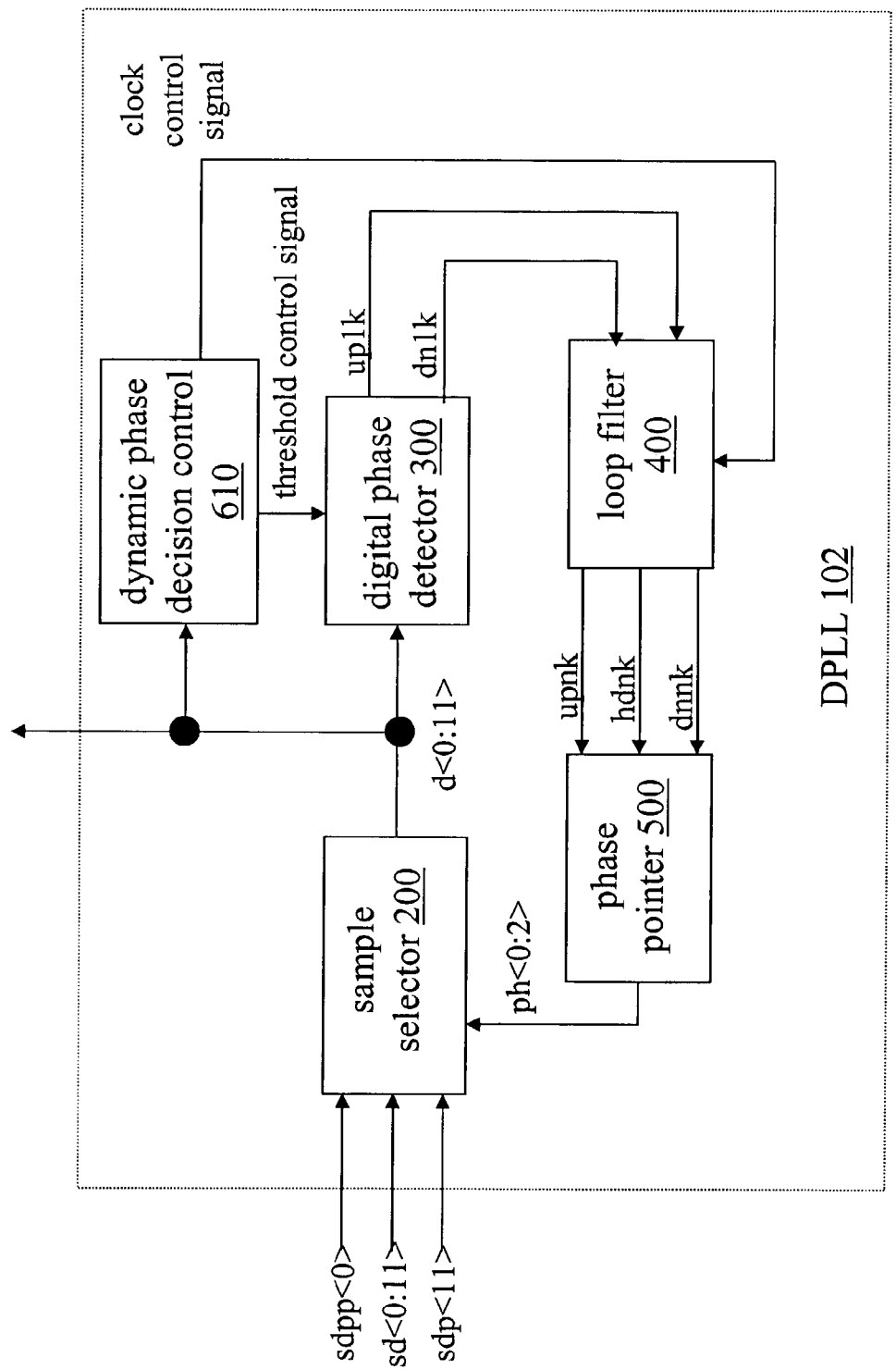
FIG. 11 shows a block diagram for an implementation 102 of DPLL 100.
Figure 12:
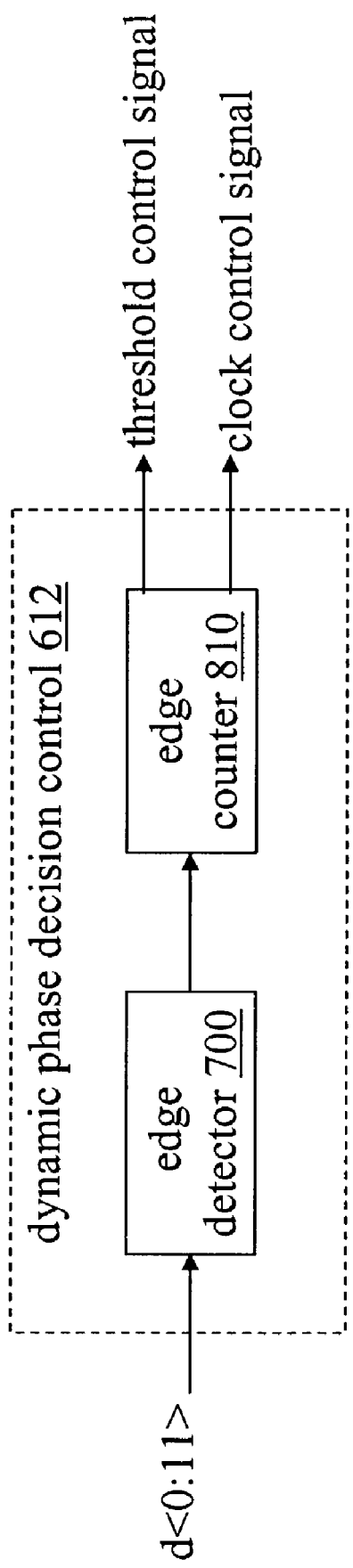
FIG. 12 shows a block diagram for an implementation 612 of dynamic phase decision control 600.
Figure 13:
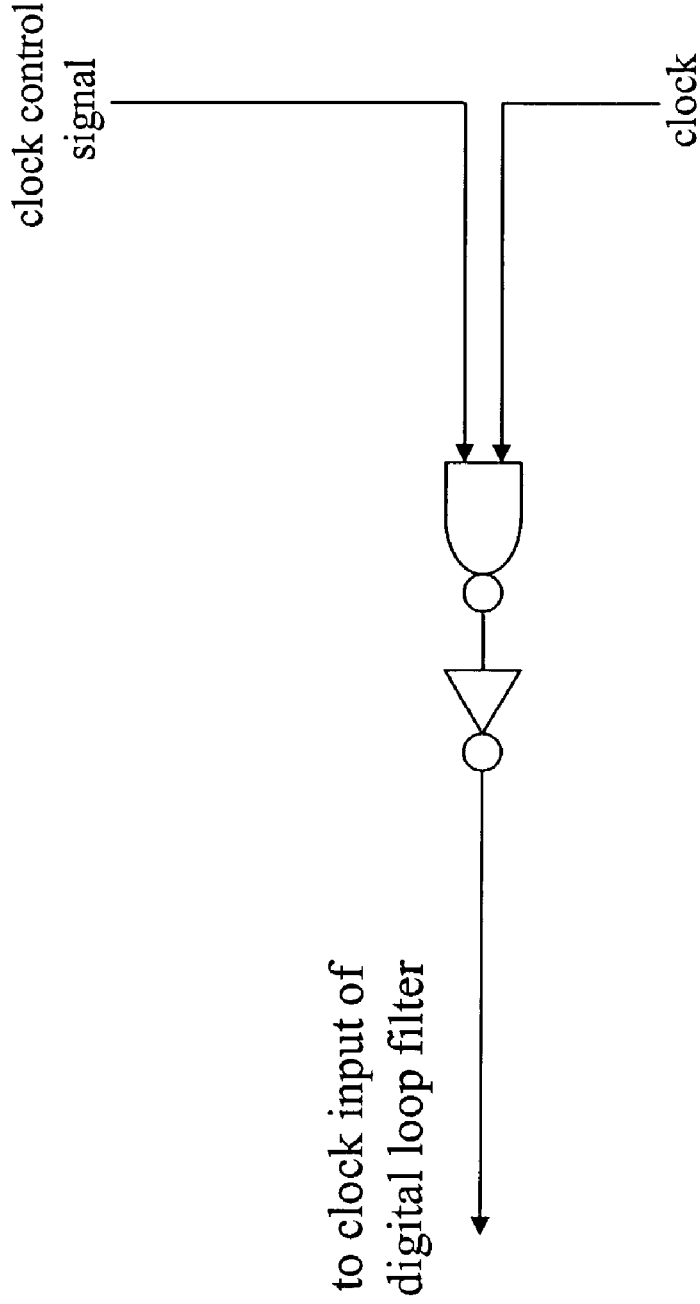
FIG. 13 shows a circuit diagram for control of a clock input.

FIG. 11 shows a block diagram for an alternate implementation 102 of DPLL 100. In this implementation, loop filter 400 is disabled (e.g. by holding its clock input low) in a case where no edges are detected in the data signal. An implementation 610 of dynamic phase decision control 600 outputs a binary-valued clock control signal that indicates whether a condition of zero edges in the selected sample has been detected. FIG. 12 shows a block diagram for an implementation 612 of dynamic phase decision control 610 that includes an implementation 810 of edge counter 800. FIG. 13 shows one possible circuit arrangement for applying the clock control signal to loop filter 400.

In a further implementation of DPLL 100, digital phase detector 300 may be configured to operate in a fixed manner (i.e. without dynamic threshold control), and dynamic phase decision control 600 may be implemented to dynamically control the clock signal to loop filter 400 (e.g. in response to an absence of edges in the data signal).

The foregoing presentation of the described embodiments is provided to enable any person skilled in the art to make or use the present invention. Various modifications to these embodiments are possible, and the generic principles presented herein may be applied to other embodiments as well.

For example, a number of DPLLs as described herein may be applied in parallel to process multi-value signals. In one such application, three DPLLs may be used to independently process the three components of a RGB video signal.

A DPLL as described herein may be used to process non-overlapping portions of a data signal. Alternatively, the oversampled portions consecutively inputted to such a DPLL may overlap by one or more data bits.

The invention may also be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor or other digital signal processing unit. Thus, the present invention is not intended to be limited to the embodiments shown above but rather is to be accorded the widest scope consistent with the principles and novel features disclosed in any fashion herein.

What is claimed is:

1. A method of signal processing, said method comprising:
   selecting a set of samples from an oversampled portion of a data signal;
   determining whether a predetermined number of edges is present in the set of samples; and
   determining a skew condition and a direction of the skew condition of the set of samples,
   wherein said determining the skew condition is based on said determining the presence of the predetermined number of edges,
   said determining the skew condition includes counting a number of oversampled bits having skew errors and comparing the number to a threshold, and wherein a value of the threshold is selected based on said determining whether the predetermined number of edges is present in the set of samples, and
   a lower value of the threshold is selected based on a determination that only one edge is present in the set of samples.

2. A method of signal processing, said method comprising:
   selecting a set of samples from an oversampled portion of a data signal;
   determining whether a predetermined number of edges is present in the set of samples; and
   determining a skew condition and a direction of the skew condition of the set of samples,
   wherein said determining the skew condition is based on said determining the presence of the predetermined number of edges, said determining the skew condition includes:
     counting a number of oversampled bits having skew errors and comparing the number to a threshold, and wherein a value of the threshold is selected based on said determining whether the predetermined number of edges is present in the set of samples, and producing a set of skew detection signals, and filtering the set of skew detection signals,
   wherein said filtering the set of skew detection signals includes producing a set of phase adjustment signals based on the set of skew detection signals, and based on the set of phase adjustment signals, selecting a set of samples from a second oversampled portion of the data signal.

3. A method of signal processing, said method comprising:
   selecting a set of samples from an oversampled portion of a data signal;
   determining whether a predetermined number of edges is present in the set of samples, said determining whether the predetermined number of edges is present in the set of samples includes detecting an absence of edges in the set of samples, and inhibiting a filtering of skew detection signals based on said detecting an absence of edges in the set of samples; and determining a skew condition and a direction of the skew condition of the set of samples, wherein said determining the skew condition is based on said determining the presence of the predetermined number of edges, said determining the skew condition includes counting a number of oversampled bits having skew errors and comparing the number to a threshold, and wherein a value of the threshold is selected based on said determining whether the predetermined number of edges is present in the set of samples.

4. A phase-locked loop comprising:

a sample selector configured to select a set of samples from an oversampled portion of a data signal;

a dynamic phase decision control configured to indicate whether a predetermined number of edges is present in the set of samples; and a phase detector configured to determine a skew condition and a direction of the skew condition of the set of samples based on the indication of the dynamic phase decision control, wherein said phase detector is configured to determine a skew condition based on a relation between a threshold and a number of skew errors detected in the set of samples, and wherein a value of the threshold is selected according to the indication of said dynamic phase decision control, and wherein a lower value of the threshold is selected according to an indication of said dynamic phase decision control that only one edge is present in the set of samples.

5. The phase-locked loop according to claim 4, wherein said dynamic phase decision control comprises:

an edge detector configured to detect edges in the set of samples; and an edge counter configured to indicate the detection of the predetermined number of edges in the set of samples.

* * * * *